United States Patent
Sasaki et al.

(10) Patent No.: US 9,848,504 B2
(45) Date of Patent: Dec. 19, 2017

(54) ELECTRONIC DEVICE HAVING A HOUSING FOR SUPPRESSION OF ELECTROMAGNETIC NOISE

(71) Applicant: Kabushiki Kaisha Toshiba, Minato-ku (JP)

(72) Inventors: Tadahiro Sasaki, Nerima (JP); Hiroshi Yamada, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/722,310

(22) Filed: May 27, 2015

(65) Prior Publication Data

US 2016/0057896 A1 Feb. 25, 2016

(30) Foreign Application Priority Data

Aug. 25, 2014 (JP) .................................. 2014-170945

(51) Int. Cl.
  *H05K 5/02* (2006.01)
  *H05K 9/00* (2006.01)
  *H01P 1/20* (2006.01)

(52) U.S. Cl.
  CPC ......... *H05K 5/0239* (2013.01); *H01P 1/2005* (2013.01); *H05K 9/0056* (2013.01); *H05K 9/0081* (2013.01)

(58) Field of Classification Search
  CPC .. H05K 9/0007; H05K 5/0239; H05K 9/0056; H05K 9/0081
  See application file for complete search history.

(56) References Cited

U.S. PATENT DOCUMENTS 3,923,359 A * 12/1975 Newsam ............... H05K 1/0287
                                                    174/254
5,838,543 A * 11/1998 Nakamura .......... H01L 23/3677
                                                    165/80.2
5,928,076 A     7/1999 Clements et al.
(Continued)

FOREIGN PATENT DOCUMENTS

JP          5-121913          5/1993
JP          5-144994          6/1993
(Continued)

*Primary Examiner* — Zachary M Pape
*Assistant Examiner* — Douglas Burtner
(74) *Attorney, Agent, or Firm* — Oblon, McClelland, Maier & Neustadt, L.L.P.

(57) ABSTRACT

According to an embodiment, an electronic device includes a housing, metal patches, and a first metal member. The housing includes a bottom, a lid, and a side unit. The side unit is disposed to enclose a space between the bottom and the lid. A circuit substrate is disposed on a bottom surface of the bottom. The side unit is conductive and connected to a ground potential. The metal patches are disposed on a lid surface of the lid. The metal patches are arranged periodically in a first direction and a second direction. The second direction intersects the first direction. The metal patches are connected to the ground potential. The first metal member is disposed on the lid surface. The first metal member is connected to the ground potential. The first metal member includes a first portion. The first portion contacts a first surface of the side unit.

20 Claims, 6 Drawing Sheets

(56) References Cited

U.S. PATENT DOCUMENTS

| | | | |
|---|---|---|---|
| 6,040,739 A * | 3/2000 | Wedeen | H01P 5/107 330/286 |
| 8,013,258 B2 | 9/2011 | Wu | |
| 8,330,048 B2 * | 12/2012 | Cho | H05K 1/0236 174/250 |
| 9,310,556 B1 * | 4/2016 | Wollack | G02B 6/14 |
| 9,634,369 B2 * | 4/2017 | Toyao | H01P 7/082 |
| 2003/0011518 A1 * | 1/2003 | Sievenpiper | H01P 1/2005 343/700 MS |
| 2008/0049949 A1 * | 2/2008 | Snider | H04B 1/082 381/86 |
| 2008/0116995 A1 * | 5/2008 | Kim | H01P 1/2005 333/161 |
| 2008/0161069 A1 * | 7/2008 | Hankui | H01M 2/1066 455/572 |
| 2010/0134996 A1 * | 6/2010 | Loiselet | H01L 21/50 361/792 |
| 2010/0156573 A1 * | 6/2010 | Smith | H01P 3/081 333/239 |
| 2010/0201465 A1 * | 8/2010 | McKinzie, III | H01P 1/16 333/251 |
| 2010/0308453 A1 * | 12/2010 | Scheid | H01L 23/3675 257/698 |
| 2011/0026234 A1 | 2/2011 | Kim et al. | |
| 2011/0134010 A1 * | 6/2011 | Toyao | H01P 1/2005 343/844 |
| 2011/0170268 A1 * | 7/2011 | Takemura | H01L 23/552 361/748 |
| 2011/0230146 A1 * | 9/2011 | Morishita | H01Q 1/243 455/77 |
| 2012/0057323 A1 * | 3/2012 | Wu | H01P 1/2005 361/818 |
| 2012/0146881 A1 * | 6/2012 | McKinzie, III | H01P 1/2005 343/909 |
| 2012/0206314 A1 * | 8/2012 | Kobayashi | H01P 1/2005 343/841 |
| 2013/0199835 A1 * | 8/2013 | Janota | H05K 9/0007 174/378 |
| 2013/0256009 A1 | 10/2013 | Sasaki et al. | |
| 2013/0293323 A1 * | 11/2013 | Nakase | H01P 3/121 333/236 |
| 2014/0028412 A1 | 1/2014 | Sasaki et al. | |
| 2014/0029227 A1 * | 1/2014 | Sasaki | H01L 24/19 361/783 |
| 2014/0062261 A1 | 3/2014 | Yamamoto et al. | |
| 2014/0154535 A1 * | 6/2014 | Olsson | H01M 2/1264 429/53 |
| 2014/0240055 A1 | 8/2014 | Sasaki et al. | |
| 2014/0252568 A1 * | 9/2014 | Hwang | H01L 23/552 257/659 |
| 2015/0022416 A1 | 1/2015 | Sasaki et al. | |
| 2015/0084167 A1 | 3/2015 | Sasaki et al. | |
| 2015/0270592 A1 * | 9/2015 | Tanaka | H01P 1/2005 333/12 |
| 2017/0033468 A1 * | 2/2017 | Wong | H01P 1/2005 |
| 2017/0172001 A1 * | 6/2017 | Sasaki | H05K 5/0217 |

FOREIGN PATENT DOCUMENTS

| | | |
|---|---|---|
| JP | 5-152455 | 6/1993 |
| JP | 5-166957 | 7/1993 |
| JP | 6-112352 | 4/1994 |
| JP | 11-17063 | 1/1999 |
| JP | 11-163568 | 6/1999 |
| JP | 11-214580 | 8/1999 |
| JP | 2002-124592 | 4/2002 |
| JP | 2003-133462 | 5/2003 |
| JP | 2004-165560 | 6/2004 |
| JP | 2011-018776 | 1/2011 |
| JP | 2011-18776 | 1/2011 |
| JP | 2011-35367 | 2/2011 |
| JP | 2013-207621 | 10/2013 |
| JP | 2014-27180 | 2/2014 |
| JP | 2014-27559 | 2/2014 |
| JP | 2014-45411 | 3/2014 |
| JP | 2014-116521 | 6/2014 |
| JP | 2014-165424 | 9/2014 |
| JP | 2015-23473 | 2/2015 |
| JP | 2015-61258 | 3/2015 |
| WO | WO 2011/068238 | 6/2011 |

* cited by examiner

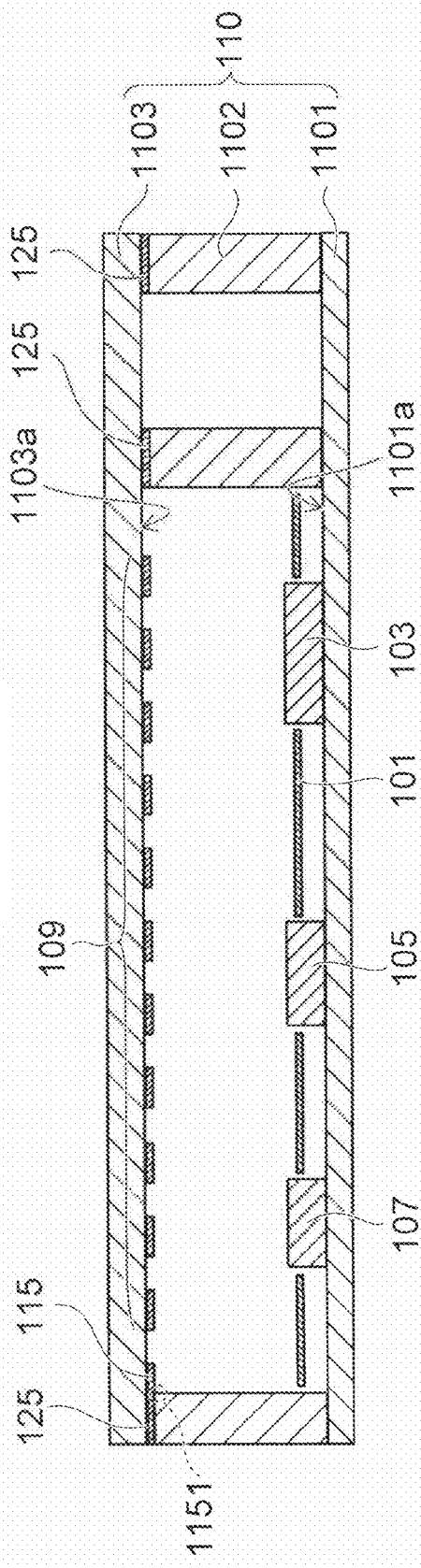
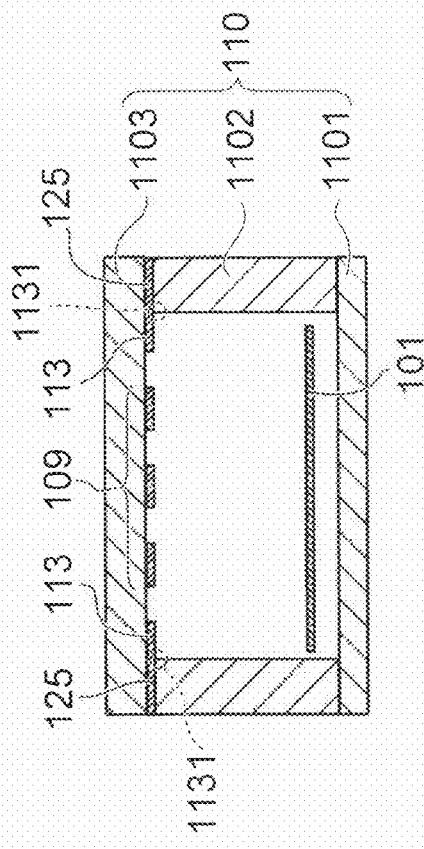
FIG. 3A
FIG. 3B

ELECTRONIC DEVICE HAVING A HOUSING FOR SUPPRESSION OF ELECTROMAGNETIC NOISE

CROSS-REFERENCE TO RELATED APPLICATIONS

This application is based upon and claims the benefit of priority from Japanese Patent Application No.2014-170945, filed on Aug. 25, 2014; the entire contents of which are incorporated herein by reference.

FIELD

Embodiments described herein relate generally to an electronic device.

BACKGROUND

A circuit substrate is placed in a housing to suppress noise caused by the circuit operation and corrosion due to external air. For an electronic device including such a housing including a circuit substrate, it is desirable for the noise generated in the interior of the housing to be low.

BRIEF DESCRIPTION OF THE DRAWINGS

FIG. 3A is an A-A' cross-sectional view of the top view shown in FIG. 2 and FIG. 3B is a B-B' cross-sectional view of the top view shown in FIG. 2;

DETAILED DESCRIPTION

Figure 1:
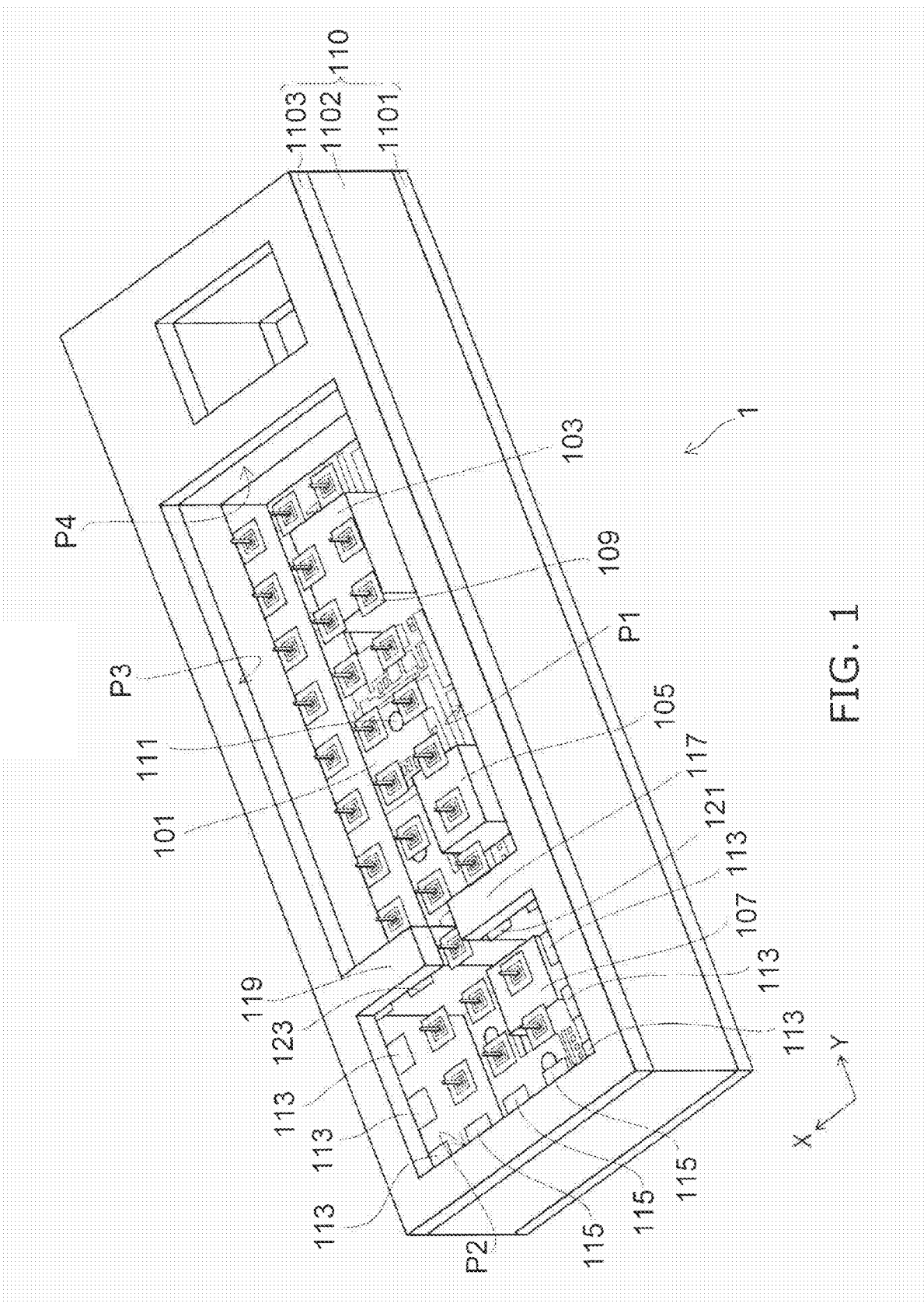
FIG. 1 is a perspective view of the electronic device according to the first embodiment of the invention.

According to an embodiment, an electronic device includes a housing, a plurality of metal patches, and a first metal member. The housing includes a bottom, a lid, and a side unit. The side unit is disposed to enclose a space between the bottom and the lid. A circuit substrate is disposed on a bottom surface of the bottom. The bottom surface is a surface of the bottom on the interior side of the housing. The side unit is conductive and connected to a ground potential. The metal patches are disposed on a lid surface of the lid. The metal patches are arranged periodically in a first direction and a second direction. The lid surface is a surface of the lid on the interior side of the housing. The second direction intersects the first direction. The metal patches are connected to the ground potential. The first metal member is disposed on the lid surface. The first metal member is connected to the ground potential. The first metal member extends in the first direction. The first metal member includes a first portion. The first portion contacts a first surface of the side unit. The first surface is one surface of the side unit on the interior side of the housing.

Description Of Embodiments

Embodiments of the invention will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First, an electronic device according to a first embodiment of the invention will be described using FIG. 1 to FIG. 3B.

FIG. 1 is a perspective view of the electronic device according to the first embodiment of the invention.

Figure 2:
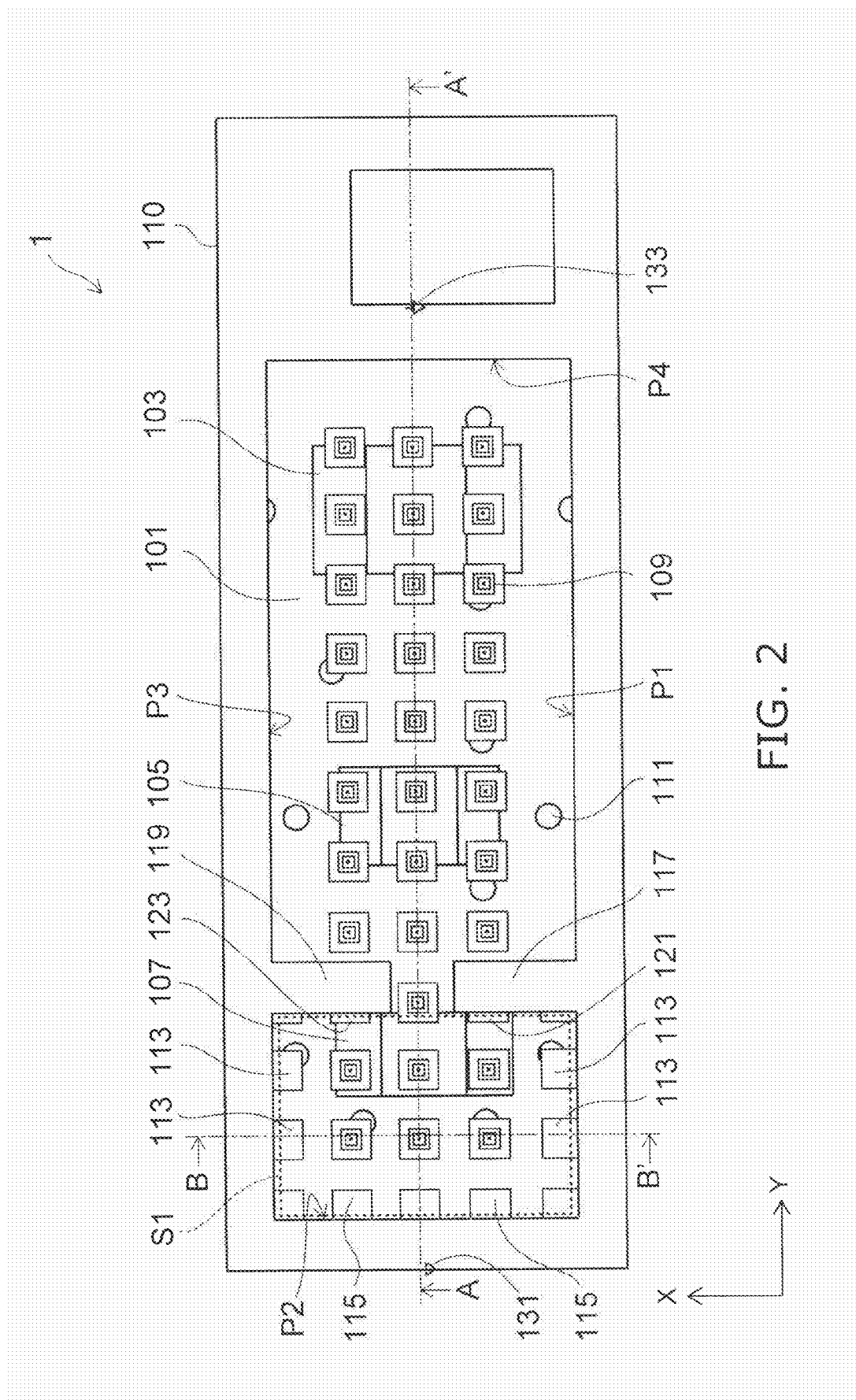
FIG. 2 is a top view of the electronic device 1 shown in FIG. 1.

FIG. 2 is a top view of the electronic device 1 shown in FIG. 1.

FIG. 3A is an A-A' cross-sectional view of the top view shown in FIG. 2. FIG. 3B is a B-B' cross-sectional view of the top view shown in FIG. 2.

A portion of a lid 1103 is not shown in FIG. 1 to describe the interior of the electronic device 1. Similarly in FIG. 2, a portion of the lid 1103 is not shown to describe the interior of the electronic device 1.

In the embodiment, "electronic device" is a concept including devices that utilize electronic circuits.

The electronic device 1 includes a housing 110. The housing 110 includes a bottom 1101, a lid 1103 that opposes the bottom 1101 and seals the interior of the housing 110, and a side unit 1102 that is disposed to enclose the space between the bottom 1101 and the lid 1103. The bottom 1101 and the side unit 1102 are conductive and are formed from a metal. The bottom 1101 and the side unit 1102 are connected to a common ground line. For example, a printed wiring board may be used as the lid 1103. The printed wiring board is, for example, an insulative substrate having a surface on which a pattern of a conductor is printed using printing technology.

A circuit substrate 101 is disposed on a surface 1101a of the bottom 1101 on the interior side of the housing 110. The circuit substrate 101 is, for example, a substrate having an electronic circuit component disposed on a surface or in the interior. Three power amplifiers 103, 105, and 107 are further disposed on the bottom surface 1101a to form a three-stage amplifier. The circuit substrate 101 is electrically connected to the bottom 1101 by a screw 111; and the circuit substrate 101 and the bottom 1101 are connected to a common ground line.

Multiple metal patches 109 are disposed on a surface 1103a of the lid 1103 on the interior side of the housing 110. The metal patches 109 are arranged periodically in a first direction and a second direction intersecting the first direction. The metal patches 109 are connected to the ground potential. The metal patches 109 that are arranged periodically form an EBG (Electromagnetic Band Gap). As an example, the first direction is an X-direction shown in FIG. 1; and the second direction is a Y-direction shown in FIG. 1.

The side unit 1102 of the housing 110 has a first surface P1 (hereinbelow, called the surface P1), a second surface P2 (hereinbelow, called the surface P2), a third surface P3 (hereinbelow called the surface P3), and a fourth surface P4 (hereinbelow called the surface P4). In the embodiment, the surfaces P1 and P3 oppose each other; and the surfaces P2 and P4 oppose each other.

Multiple first metal members 113 and multiple second metal members 115 are disposed on the lid surface 1103a.

The first metal members 113 and the second metal members 115 are connected to the ground potential. To form an EBG for electromagnetic noise of a prescribed frequency, it is favorable for the first metal members 113 to be arranged periodically so that the widths of the first metal members 113 are equal to each other in the second direction, and the first metal members 113 adjacent to each other in the second direction have equal spacing. Some of the first metal members 113 extend in the first direction, are arranged periodically along the surface P1, and respectively include portions contacting the surface P1. Other first metal members 113 extend in the direction opposite to the first direction, are arranged periodically along the surface P3, and respectively include portions contacting the surface P3. In other words, some of the first metal members 113 extend in the direction from the surface P1 toward the surface P3; and other first metal members 113 extend in the direction from the surface P3 toward the surface P1. Also, to form the EBG for the electromagnetic noise of the prescribed frequency, it is favorable for the second metal members 115 to be arranged periodically along the surface P2 so that the widths of the second metal members 115 are equal to each other in the first direction, and the second metal members 115 adjacent to each other in the first direction have equal spacing. The second metal members 115 extend in the second direction and respectively include second portions contacting the surface P2.

In FIG. 1, the metal members that contact both the surface P1 and the surface P2 are both first metal members 113 and second metal members 115. Similarly, the metal members that contact both the surface P2 and the surface P3 are both first metal members 113 and second metal members 115.

"The first metal members 113 being arranged periodically" also includes the case where the widths of the first metal members 113 in the second direction are different from each other. In other words, if the first metal members 113 adjacent to each other in the second direction have equal spacing, the first metal members 113 are considered to be arranged periodically in the second direction even in the case where the widths of the first metal members 113 in the second direction are different from each other.

Similarly, "the second metal members 115 being arranged periodically" also includes the case where the widths of the second metal members 115 in the first direction are different from each other. In other words, if the second metal members 115 adjacent to each other in the first direction have equal spacing, the second metal members 115 are considered to be arranged periodically in the first direction even in the case where the widths of the second metal members 115 in the first direction are different from each other.

Each of the first metal members 113 is arranged with a portion of the multiple metal patches 109 in the first direction. In other words, in the case where a prescribed imaginary line that extends in the first direction is considered, the first metal member 113 and a portion of the multiple metal patches 109 exist on the imaginary line. Also, each of the second metal members 115 is arranged with a portion of the metal patches 109 in the second direction. In other words, in the case where a prescribed imaginary line that extends in the second direction is considered, the second metal member 115 and a portion of the multiple metal patches 109 exist on the imaginary line.

The housing 110 includes a first protrusion 117 protruding in the first direction from the side unit 1102, and a second protrusion 119 protruding in the direction opposite to the first direction from the side unit 1102. Further, third metal members 121 that include third portions contacting the first protrusion 117 are disposed at the lid surface 1103a; and fourth metal members 123 that include fourth portions contacting the second protrusion 119 is disposed at the lid surface 1103a. The third metal members 121 are arranged in the first direction; and each of the third metal members 121 extends in the direction opposite to the second direction. The fourth metal members 123 are arranged in the first direction; and each of the fourth metal members 123 extends in the direction opposite to the second direction. The third metal members 121 and the fourth metal members 123 are connected to the ground potential. The spacing between the third metal members 121 in the first direction and the spacing between the fourth metal members 123 in the first direction are determined to form the EBG for the electromagnetic noise of the prescribed frequency.

In FIG. 1, the metal members that contact both the surface P1 and the first protrusion 117 are both first metal members 113 and third metal members 121. Similarly, the metal members that contact both the surface P3 and the second protrusion 119 are both first metal members 113 and fourth metal members 123.

The third metal members 121 and the fourth metal members 123 are arranged in the first direction. In other words, in the case where a prescribed imaginary line that extends in the first direction is considered, the third metal members 121 and the fourth metal members 123 exist on the imaginary line.

The first metal member 113 has two sides extending in the first direction and one side extending in the second direction. The other second to fourth metal members 115 to 123 similarly have sides extending in prescribed directions. The first to fourth metal members 113 to 123 are quadrilaterals as viewed in plan. In the embodiment, the first to fourth metal members 113 to 123 are rectangles as viewed in plan.

In the embodiment as shown in FIG. 2, the first metal members 113, the second metal members 115, the third metal members 121, and the fourth metal members 123 are disposed inside a space S1 enclosed with the surface P2, a portion of the surface P1, a portion of the surface P3, the first protrusion 117, and the second protrusion 119.

An input port 131 to which a high frequency signal is input is disposed on the surface P2 side; and an output port 133 is disposed on the surface P4 side.

A first metal film 125 is disposed between the side unit 1102 and the lid 1103. The first metal members 113 and the second metal members 115 are portions of the first metal film 125 that protrude from the first metal film 125. The first metal members 113 and the second metal members 115 are portions of the first metal film 125 that are not interposed between the side unit 1102 and the lid 1103.

The first metal member 113 includes a first portion 1131 contacting the surface P1; and the second metal member 115 includes a second portion 1151 contacting the surface P2.

Figure 4:
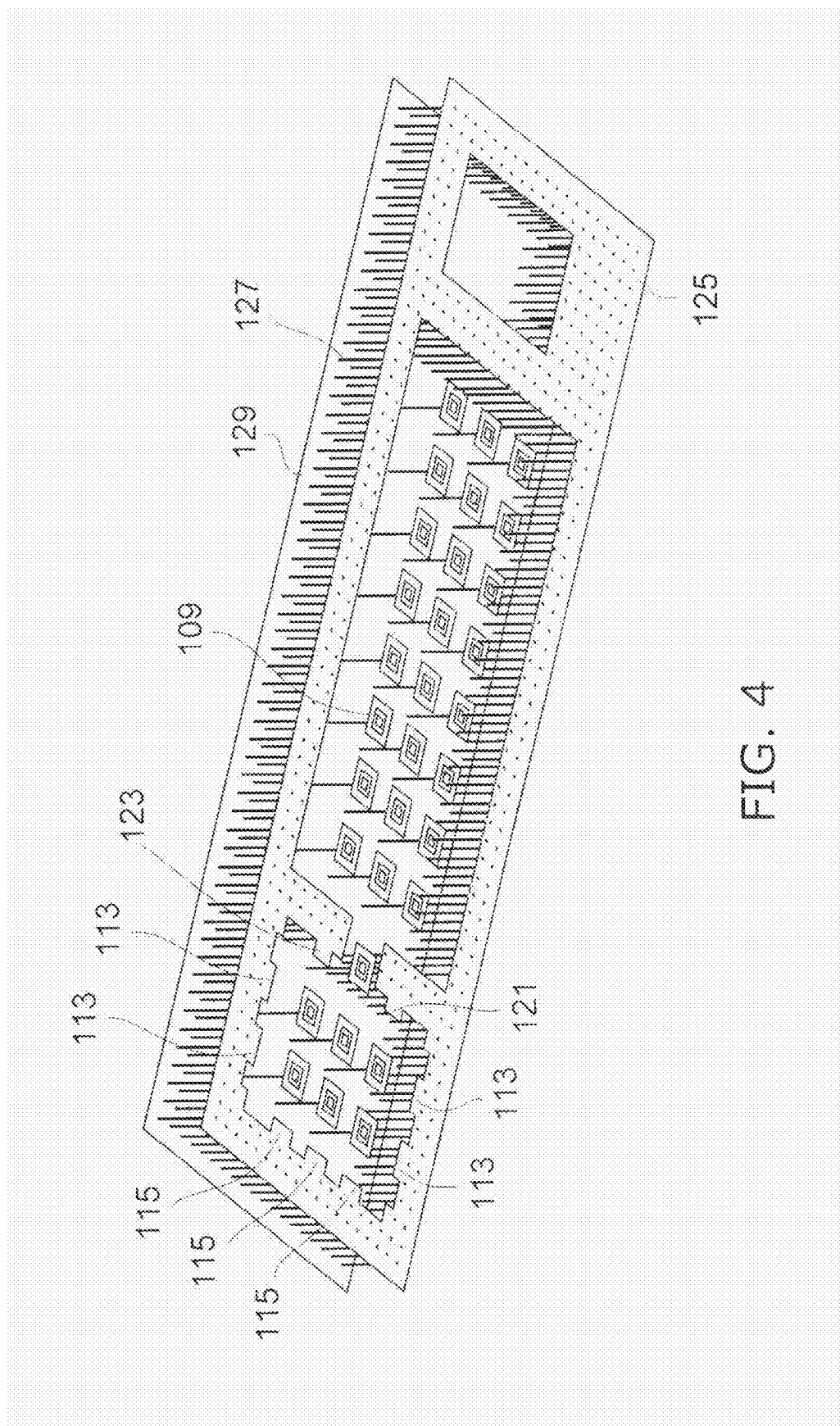
FIG. 4 is a perspective view showing the state of the lid 1103 as viewed obliquely from below FIG. 1.

FIG. 4 is a perspective view showing the state of the lid 1103 as viewed obliquely from below FIG. 1. The metal patches 109, the first metal members 113, the second metal members 115, the third metal members 121, the fourth metal members 123, and the first metal film 125 are disposed on the lid surface 1103a.

As shown in FIG. 4, the first metal members 113, the second metal members 115, the third metal members 121, and the fourth metal members 123 are portions of the first metal film 125 protruding toward the interior side of the housing 110 or toward the space S1 side. Accordingly, a material included in the first to fourth metal members 113 to 123 is the same as a material included in the first metal film 125. The first to fourth metal members 113 to 123 are portions of the first metal film 125 that are not interposed between the side unit 1102 and the lid 1103.

A second metal film 129 is disposed at the upper surface of the lid 1103 (the surface on the side opposite to the lid surface 1103a). The first metal film 125 and the metal patches 109 are electrically connected to the second metal film 129 by multiple vias 127 piercing the lid 1103. The second metal film 129 is electrically connected to the bottom 1101 via the side unit 1102 of the housing 110 and is connected to the ground potential. In other words, the first metal film 125 and the metal patches 109 are electrically connected to each other and are connected to a common ground line.

For example, the first metal film 125 and the metal patches 109 are formed by forming a patterned metal film as shown in FIG. 4 on the printed wiring board used as the lid 1103 by plating. Accordingly, in the embodiment, a material included in the first metal film 125 is the same as a material included in the metal patches 109.

Figure 5:
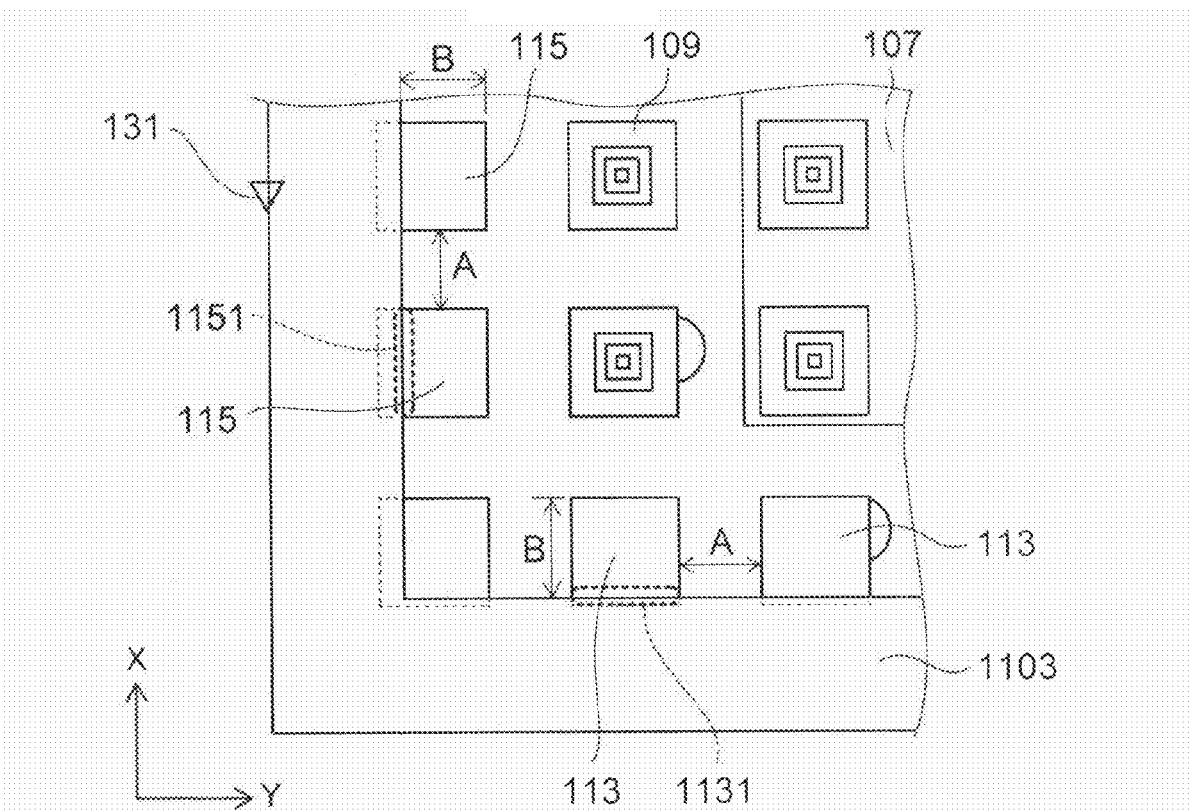
FIG. 5 shows an enlarged portion of FIG. 2.

FIG. 5 shows an enlarged portion of FIG. 2.

To suppress the noise more effectively, it is favorable for a distance A between the first metal members 113 that are adjacent to each other and between the second metal members 115 that are adjacent to each other to be not less than ¼ and not more than ½ the wavelength of the high frequency wave input to the input port 131.

Also, it is favorable for a length B to be not less than 1/20 and not more than ⅙ the wavelength of the high frequency wave input to the input port 131, where the length B is the length in the first direction of the first metal member 113 from the first portion 1131 contacting the surface P1 or the length in the second direction of the second metal member 115 from the second portion 1151 contacting the surface P2. In other words, the length B is the length of the first metal member 113 from the surface P1 to the end portion in the first direction or the length of the second metal member 115 from the surface P2 in the second direction as viewed in plan.

In the electronic device 1 according to the embodiment, it is favorable for the metal patches 109, the first metal members 113, and the second metal members 115 to have the following relationship to effectively reduce the electromagnetic noise of the prescribed frequency.

In the first direction and the second direction, the metal patches 109 adjacent to each other have equal spacing. In the second direction, the first metal members 113 are arranged so that the distance between the first metal members 113 adjacent to each other is equal to the distance between the metal patches 109 adjacent to each other. In the first direction, the second metal members 115 are arranged so that the distance between the second metal members 115 adjacent to each other is equal to the distance between the metal patches 109 adjacent to each other. The distance from the end portion of the first metal member 113 to the most proximal metal patch 109 in the first direction and the distance from the end portion of the second metal member 115 to the most proximal metal patch 109 in the second direction are equal to the distance between the metal patches 109 adjacent to each other.

Figure 6:
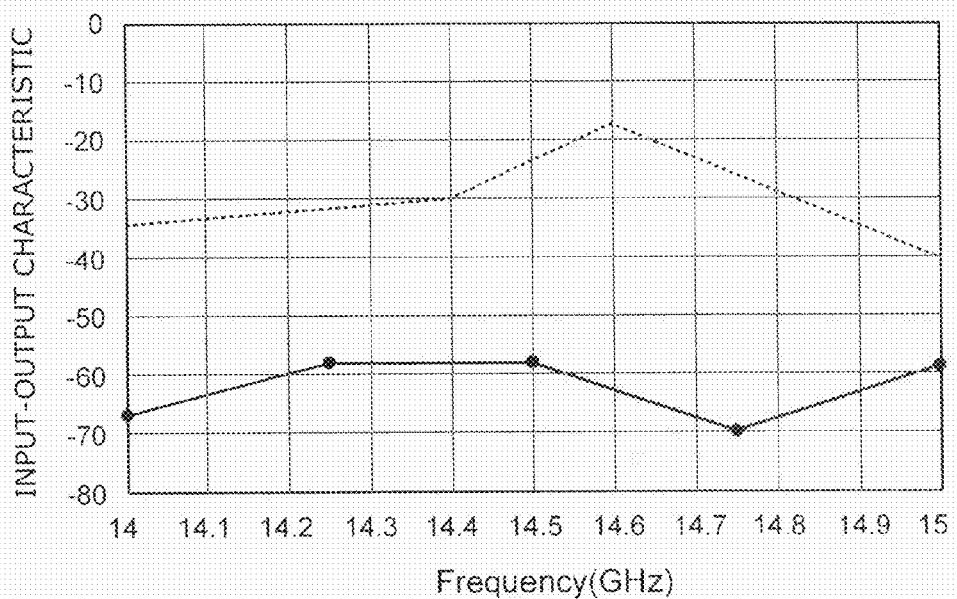
FIG. 6 shows simulation results comparing the noise intensity in the interior of the electronic device 1 and in the interior of an electronic device of a comparative example.

Here, FIG. 6 shows simulation results comparing the noise intensity in the interior of the electronic device 1 that includes the first to fourth metal members 113 to 123, the first protrusion 117, and the second protrusion 119 and in the interior of an electronic device of a comparative example that does not include the first to fourth metal members 113 to 123, the first protrusion 117, and the second protrusion 119.

In FIG. 6, the horizontal axis is the frequency of the high frequency wave that is input; and the vertical axis is the input-output characteristic from the input port 131 to the output port 133 of the housing 110.

The broken line illustrates the result of the electronic device of the comparative example; and the solid line illustrates the result of the electronic device 1 according to the embodiment. For example, the comparative example has a gain of −20 dB for an input signal of 0 dBm at 14.6 GHz. Accordingly, for a signal having an output of 0 dBm or more and a gain greater than 20 dB, the power amplifier undesirably oscillates. Conversely, in the electronic device 1 according to the embodiment, the resonant frequency of the housing can be −60 dB or less in the frequency range of 14.00 GHz to 15.00 GHz.

FIGS. 7A to 7D show other simulation results of the electronic device 1 and the comparative example described above.

Figure 7A:
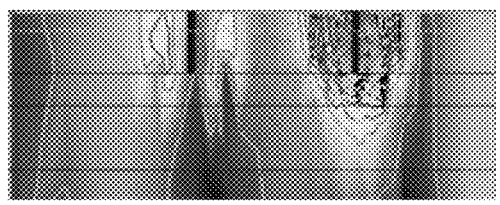
FIGS. 7A to 7D show other simulation results of the electronic device 1 and the comparative example.
Figure 7B:
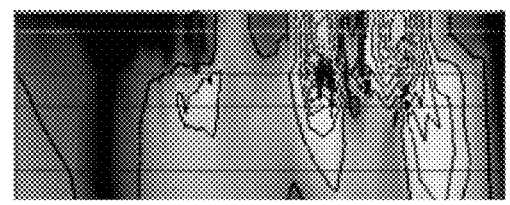
Figure 7C:
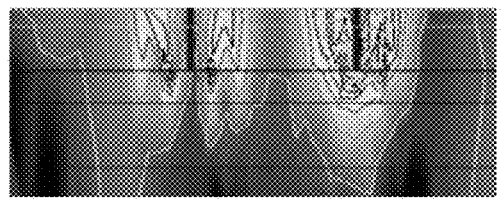
Figure 7D:
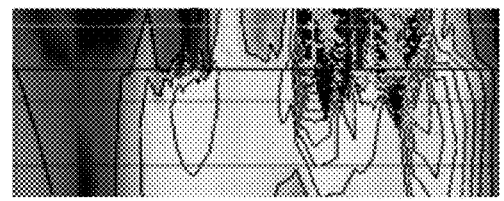

FIGS. 7A to 7D are results of performing electromagnetic field analysis of the near field in a prescribed region of the housing interior for the electronic device 1 and the comparative example. FIG. 7A shows the analysis result of the magnetic field of the comparative example; and FIG. 7B shows the analysis result of the electric field of the comparative example. FIG. 7C shows the analysis result of the magnetic field of the electronic device 1; and FIG. 7D shows the analysis result of the electric field of the electronic device 1. In FIGS. 7A to 7D, the electric field or the magnetic field is displayed as being stronger as the color becomes lighter (whiter) and weaker as the color becomes darker (blacker).

As a result of diligent research performed by the inventors, it was found that the magnitude of the noise generated in the housing interior has a relationship particularly with the magnetic field strength in the housing interior. Comparing FIGS. 7A and 7C, it can be seen that compared to the comparative example, the magnetic field strength is weaker for the electronic device 1. On the other hand, comparing FIGS. 7B and 7D, compared to the comparative example, the electric field strength is stronger for the electronic device 1.

Accordingly, it can be seen that in the electronic device 1 of the embodiment, the magnetic field strength of the housing 110 interior is suppressed by increasing the electric field strength of the housing 110 interior; and as a result, the noise can be suppressed.

The noise can be largely divided into coupling of the inter-lead capacitance on the circuit substrate, and noise that propagates through space. The noise of the former can be suppressed by a filter circuit or by increasing the lead spacing because it is sufficient to break the capacitive coupling between the leads. On the other hand, it is difficult to use a filter to reduce the noise that propagates through space of the latter. To solve this problem, a method may be considered in which a material that absorbs electromagnetic waves or suppresses the reflections of electromagnetic waves is adhered to the side walls inside the housing. However, this method is problematic in that the circuit operation shifts from the initial design because the dielectric constant of the material that is adhered is added to the dielectric constant of the initial circuit design. Also, there is a secondary problem in that it takes time during development to determine by experiment the location to adhere the material.

Housings can be largely divided into resin housings and metal housings. In particular, in the case of a circuit for which it is indispensable to shield the noise from the outside, at least a portion of the housing is formed of a metal. In such a case, the metal portion of the housing is connected to the ground potential. However, in the case where such a metal housing is used, problems include reflections of the electromagnetic waves inside the housing by the side walls and/or the ceiling which causes housing resonance and/or oscillations of the electronic circuit disposed inside the housing. The noise that is caused by the reflections of the electromagnetic waves inside the housing increases more easily as the height of the housing is reduced. An electronic device having a low housing height is problematic in that it is not easy to sufficiently reduce the noise using only the metal patches 109; and as a result, the metal housing height cannot be reduced.

Conversely, according to the structure of the embodiment in which the EBG is formed not only by the multiple metal patches 109 but also the first metal members 113, the second metal members 115, the third metal members 121, and the fourth metal members 123 that are connected to the ground potential and formed of metals, the oscillation of the amplifiers and the resonance of the housing can be suppressed effectively as in the results shown in FIG. 6. Therefore, even in the case where the height of the housing 110 is low, it is possible to reduce the noise generated in the interior of the housing 110.

According to the embodiment as in the results shown in FIGS. 7A to 7D, the resistance to the magnetic field can be increased at the vicinity of the side unit 1102 that is formed of a metal. Therefore, it is possible to favorably reduce the magnetic field strength of the electromagnetic waves reflected by the side unit 1102 and the electromagnetic waves traveling along the side unit 1102. As a result, an electronic device can be provided in which it is possible to reduce the noise generated in the interior while suppressing the noise entering from the outside.

In the embodiment, because the printed wiring board is used as the lid 1103, the weight of the housing 110 is light; and it is possible to make the housing 110 inexpensively.

In the electronic device 1, the space S1 is defined using the first protrusion 117 and the second protrusion 119. Generally, there is a tendency for the noise generated in the housing interior to increase as the space of the housing interior increases in the in-plane direction of the bottom where the circuit substrate 101 is disposed. It is possible to reduce the noise by dividing the space in the in-plane direction of the bottom 1101 by the first protrusion 117 and the second protrusion 119.

In the embodiment, the gain of the power amplifier 107 is the largest among the power amplifiers 103, 105, and 107. It is possible to effectively reduce the noise by disposing the power amplifier 107 inside the space S1.

By providing the third metal members 121 that contact the first protrusion 117 and the fourth metal members 123 that contact the second protrusion 119, it is possible to suppress the noise inside the housing 110 even further. By providing the first protrusion 117 and the second protrusion 119, it is possible to increase the region where metal members for reducing the noise can be disposed.

Although the first metal members 113 and the second metal members 115 are disposed only in the region facing the space S1 in the embodiment, the first metal members 113 and the second metal members 115 may be disposed in other regions.

Although multiple metal members are disposed in the embodiment, as long as at least one metal member is disposed, the effect of reducing the magnetic field strength in the interior of the housing 110 is obtained; and it is possible to reduce the noise generated in the interior of the housing 110.

In the embodiment, the first metal members 113, the second metal members 115, the third metal members 121, and the fourth metal members 123 are portions of the first metal film 125; and a material of the first to fourth metal members 113 to 123 is the same as a material of the first metal film 125. However, this is not limited thereto; and the first to fourth metal members 113 to 123 may be formed of materials different from that of the first metal film 125.

In the embodiment, a material of the first metal film 125 is the same as a material of the metal patches 109. However, this is not limited thereto; and the first metal film 125 and the metal patches 109 may be formed from mutually-different materials.

An electronic device according to a second embodiment of the invention will now be described using FIG. 8. In the electronic device 2, the configurations of the first metal member and the second metal member are different from those of the electronic device 1 according to the first embodiment.

In the embodiment, an end portion 1412 of a first metal member 141 in the first direction has an arc configuration. A hollow portion 1413 is made between the end portion 1412 and first portions 1411 contacting the surface P1. Similarly, a second metal member 143 includes an end portion 1432 in the second direction; and a hollow portion 1433 is made between the end portion 1432 and second portions 1431 contacting the surface P2.

In the embodiment as well, the noise in the interior of the housing 110 can be reduced further by disposing the first metal member 141 and the second metal member 143 than in the case where the first metal member 141 and the second metal member 143 are not disposed.

Figure 8:
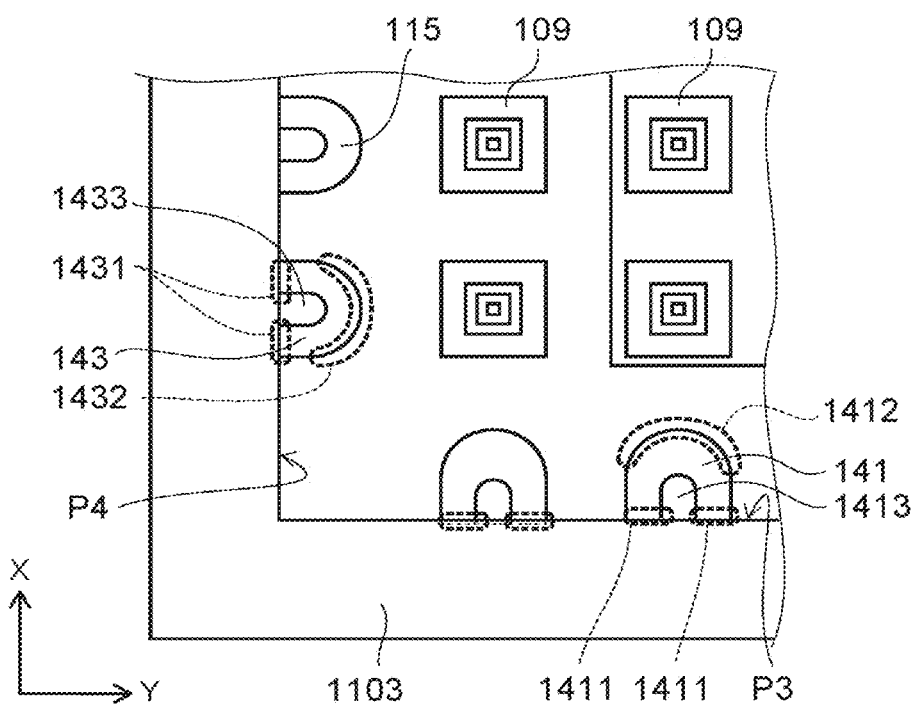
FIG. 8 shows an enlarged portion of the electronic device according to the second embodiment of the invention.

Although not-shown in FIG. 8, in addition to the first metal member 141 and the second metal member 143, the electronic device 2 may include a third metal member and a fourth metal member that include end portions having arc configurations similar to those of the first metal member 141 and the second metal member 143.

Hereinabove, embodiments of the invention are described with reference to specific examples. However, the invention is not limited to these specific examples. For example, one skilled in the art may similarly practice the invention by appropriately selecting specific configurations of components such as the housing, the circuit substrate, the metal patch, the input port, the output port, the power amplifier, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

In the description of the embodiment, the expressions "bottom" and "lid" are used for the purpose of description. These terms merely refer to the portions of the housing such that the portion where the circuit substrate is disposed is referred to as the bottom, and the wall opposing the bottom is referred to as the lid. In other words, the bottom is not necessarily positioned at the lower part of the housing; and the bottom and the lid may be inverted when the electronic device is mounted, etc.

Moreover, all electronic devices practicable by an appropriate design modification by one skilled in the art based on the electronic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic device, comprising:
   a housing including a bottom portion, a top portion, a side portion, and a first protrusion, the side portion being provided between the bottom portion and the top portion, the side portion having a first surface and a third surface, the first surface crossing a plane perpendicular to a direction from the bottom portion to the top portion, the third surface opposing the first surface, the first protrusion protruding from the first surface toward the third surface;
   a plurality of metal patches provided between the bottom portion and the top portion, the metal patches being arranged periodically in a first direction and a second direction, the first direction being along the plane, the second direction being along the plane and crossing the first direction, the metal patches being electrically connected with the side portion;
   a first metal portion provided between the bottom portion and the top portion, the first metal portion being electrically connected with the side portion, the first metal portion being apart from the metal patches, the first metal portion physically contacting the first surface; and
   a third metal portion provided between the bottom portion and the top portion, the third metal portion being apart from the metal patches and the first metal portion, the third metal portion physically contacting the first protrusion, the third metal portion being electrically connected with the side portion.

2. The device according to claim 1, wherein a direction from the first metal portion toward one of the metal patches is along the first direction.

3. The device according to claim 2, wherein the first metal portion is provided in a plurality, and
   the first metal portions are arranged periodically in the second direction.

4. The device according to claim 3, further comprising a second metal portion provided between the bottom portion and the top portion,
   the second metal portion being electrically connected with the side portion,
   the second metal portion being apart from the metal patches and the first metal portions,
   the side portion further having a second surface crossing the second direction,
   the second metal portion physically contacting the second surface.

5. The device according to claim 4, wherein the second metal portion is provided in a plurality,
   the second metal portions are arranged periodically in the first direction.

6. The device according to claim 5, wherein a direction from one of the second metal portions toward one of the metal patches is along the second direction.

7. The device according to claim 6, wherein a distance between two of the first metal portions adjacent to each other in the second direction is equal to a distance between two of the metal patches adjacent to each other in the second direction.

8. The device according to claim 7, wherein a distance between two of the second metal portions adjacent to each other in the first direction is equal to a distance between two of the metal patches adjacent to each other in the first direction.

9. The device according to claim 1, further comprising a first metal film having an annular configuration provided between the bottom portion and the top portion,
   the first metal portion being a portion of the first metal film,
   a material of the first metal portion being the same as a material of the first metal film.

10. The device according to claim 1, wherein a material of the first metal portion is the same as a material of the metal patch.

11. The device according to claim 6, wherein
    the side portion further has a third surface opposing the first surface,
    the housing further includes a first protrusion protruding from the first surface toward the third surface.

12. The device according to claim 11,
    the third metal portion being apart from the second metal portions.

13. The device according to claim 12, wherein
    the housing further includes a second protrusion protruding from the third surface toward the first surface, and
    a direction from the first protrusion toward the second protrusion is along the first direction.

14. The device according to claim 13, further comprising a fourth metal portion provided between the bottom portion and the top portion, the fourth metal portion being apart from the metal patches, the first metal portions, the second metal portions, and the third metal portion, the fourth metal portion physically contacting the second protrusion, the fourth metal portion being electrically connected with the side portion.

15. The device according to claim 14, wherein a direction from the third metal portion toward the fourth metal portion is along the first direction.

16. The device according to claim 13, further comprising a power amplifier,
    the power amplifier being disposed inside a space,
    the first surface, the second surface, the third surface, the first protrusion, and the second protrusion being provided around the space.

17. The device according to claim 1, wherein the top portion is a printed wiring board.

18. The device according to claim 1. wherein the first metal portion includes an outer edge having an arc configuration, and a hollow provided between the outer edge and the first surface.

19. The device according to claim 1, further comprising a circuit substrate provided between the bottom portion and the metal patches.

20. The device according to claim 1, further comprising:
   a second metal film electrically connected with the side portion; and
   a plurality of conductive member extending in the top portion along the direction from the bottom portion to the top portion and electrically connected with the second metal film,
   the top portion being provided between the metal patches and the second metal film,
   the conductive members being respectively connected with the metal patches.

* * * * *